(12) United States Patent
Wang et al.

(10) Patent No.: US 12,507,576 B2
(45) Date of Patent: Dec. 23, 2025

(54) DISPLAY DEVICE AND NEAR-EYE DISPLAY APPARATUS

(71) Applicant: BOE Technology Group Co., Ltd., Beijing (CN)

(72) Inventors: Can Wang, Beijing (CN); Xiandong Meng, Beijing (CN); Qiuyu Ling, Beijing (CN); Angran Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 554 days.

(21) Appl. No.: 17/921,914

(22) PCT Filed: Jun. 8, 2021

(86) PCT No.: PCT/CN2021/098924
§ 371 (c)(1),
(2) Date: Oct. 27, 2022

(87) PCT Pub. No.: WO2022/022076
PCT Pub. Date: Feb. 3, 2022

(65) Prior Publication Data
US 2023/0180586 A1 Jun. 8, 2023

(30) Foreign Application Priority Data
Jul. 31, 2020 (CN) .......................... 202010761074.2

(51) Int. Cl.
*H10K 59/80* (2023.01)
*H10K 59/35* (2023.01)
(52) U.S. Cl.
CPC .......... *H10K 59/879* (2023.02); *H10K 59/35* (2023.02)

(58) Field of Classification Search
None
See application file for complete search history.

(56) References Cited

U.S. PATENT DOCUMENTS

2012/0032590 A1 2/2012 Sakaguchi et al.
2012/0262502 A1 10/2012 Hoeschen et al.
(Continued)

FOREIGN PATENT DOCUMENTS

CN 102376742 A 3/2012
CN 102770795 A 11/2012
(Continued)

OTHER PUBLICATIONS

CN202010761074.2 second office action.
CN202010761074.2 first office action.
PCT/CN2021/098924 international search report.

*Primary Examiner* — Nicholas J Lee
(74) *Attorney, Agent, or Firm* — IPro, PLLC

(57) ABSTRACT

The present disclosure provides a display device and a near-eye display apparatus. The display device includes: a base substrate; a light-emitting layer located on the side of the base substrate and including a plurality of light-emitting portions; a package layer located on the side of the light-emitting layer away from the base substrate; and a lens layer located on the side of the package layer away from the light-emitting layer, and including a plurality of lens structures having one-to-one correspondence to the light-emitting portions and protruding towards the sides distant from the light-emitting portions. On a cross section perpendicular to the base substrate, the center of the orthographic projection of the at least one lens structure on the base substrate does not overlap the center of the orthographic projection of a corresponding light-emitting portion on the base substrate.

14 Claims, 6 Drawing Sheets

(56) References Cited

U.S. PATENT DOCUMENTS

| | | |
|---|---|---|
| 2021/0003900 A1* | 1/2021 | Chen ................... H10K 59/879 |
| 2021/0057678 A1 | 2/2021 | Motoyama et al. |
| 2022/0115629 A1 | 4/2022 | Suzuki et al. |
| 2022/0308349 A1 | 9/2022 | Yan et al. |

FOREIGN PATENT DOCUMENTS

| | | | | |
|---|---|---|---|---|
| CN | 104678641 A | | 6/2015 | |
| CN | 108710217 A | * | 10/2018 | ............. G02B 27/46 |
| CN | 110634415 A | | 12/2019 | |
| CN | 111175982 A | | 5/2020 | |
| CN | 111864119 A | | 10/2020 | |
| JP | 2013114772 A | | 6/2013 | |
| JP | 2019133816 A | | 8/2019 | |
| WO | 2020111101 A1 | | 6/2020 | |

* cited by examiner

DISPLAY DEVICE AND NEAR-EYE DISPLAY APPARATUS

CROSS REFERENCE TO RELATED APPLICATIONS

The present application is a US National Stage of International Application No. PCT/CN2021/098924, filed on Jun. 8, 2021, which claims priority to the Chinese Patent Application No. 202010761074.2, filed to the China Patent Office on Jul. 31, 2020 and entitled "DISPLAY DEVICE AND NEAR-EYE DISPLAY APPARATUS", which is hereby incorporated by reference in its entirety.

FIELD

The present disclosure relates to the technical field of display, in particular to a display device and a near-eye display apparatus.

BACKGROUND

Near-eye display apparatuses (e.g., augmented reality (AR)) have developed rapidly in recent years, and high-end products use an optical waveguide technology for thin and light processing, but light loss of the optical waveguide is large and high device brightness (>3000 nit) is needed. Silicon-based organic light-emitting diodes (OLEDs) have the advantages of being self-luminous, thin and light, which can meet the demand of AR portability, but the device luminance is low (<1500 nit), which cannot correspond to the demand of AR high brightness. Moreover, in order to fit an optical system, specific angle customization needs to be used in an AR optical system.

SUMMARY

An embodiment of the present disclosure provides a display device, including:
 a base substrate;
 a light-emitting layer located on one side of the base substrate and including a plurality of light-emitting portions;
 a package layer located on a side, facing away from the base substrate, of the light-emitting layer; and
 a lens layer located on a side, facing away from the light-emitting layer, of the package layer; where the lens layer includes a plurality of lens structures which have one-to-one correspondence with the light-emitting portions and protruding towards sides away from the light-emitting portions; and on a cross section perpendicular to the base substrate, a center of an orthographic projection of at least one lens structure on the base substrate does not overlap a center of an orthographic projection of a corresponding light-emitting portion on the base substrate.

In a possible implementation, an area of a surface of each lens structure facing the corresponding light-emitting portion is greater than an area of a surface of each light-emitting portion facing the lens structure; in the lens structures from a first symmetry axis to at least one side edge along a first direction, the lens structures are sequentially staggered relative to the light-emitting portions; and the first symmetry axis passes through a center of the display device and is perpendicular to the first direction.

In a possible implementation, in the lens structures from the first symmetry axis to the at least one side edge along the first direction, staggered lengths of the lens structures relative to the light-emitting portions are sequentially increased.

In a possible implementation, a length A of the surface of each lens structure facing the corresponding light-emitting portion in the first direction, and a length B of the surface of each light-emitting portion facing the corresponding lens structure in the first direction, satisfy the following relationship:
 A−B=L1/N, where L1 is a staggered length of the lens structure at an edge relative to the light-emitting portion at the edge in the first direction, and N is the number of the light-emitting portions staggered from the middle light-emitting portion to one side edge along the first direction.

In a possible implementation, a color resist film layer is arranged between the package layer and the lens layer, and includes a plurality of color resist portions; an area of a surface of each color resist portion facing the corresponding light-emitting portion is greater than an area of a surface of each light-emitting portion facing the color resist portion; and in the color resist portions from the first symmetry axis to at least one side edge along the first direction, the color resist portions are sequentially staggered relative to the light-emitting portions.

In a possible implementation, in the color resist portions from the first symmetry axis to the at least one side edge along the first direction, staggered lengths of the color resist portions relative to the light-emitting portions are sequentially increased.

In a possible implementation, a length C of a surface of each color resist portion facing the corresponding lens structure in the first direction, and the length B of the surface of each light-emitting portion facing the corresponding lens structure in the first direction, satisfy the following relationship:
 C−B=L2/N, where L2 is a staggered length of the color resist portion at an edge relative to the light-emitting portion at the edge in the first direction.

In a possible implementation, the length of the surface of each color resist portion facing the corresponding lens structure in the first direction is less than the length of the surface of each lens structure facing the corresponding light-emitting portion in the first direction.

In a possible implementation, the adjacent color resist portions have an overlapping region.

In a possible implementation, a protective layer is arranged on a side, facing away from the package layer, of the lens layer; and
 a ratio of a refraction index of the protective layer to a refraction index of the lens structures is greater than 1.1.

In a possible implementation, a flat layer is arranged between the color resist film layer and the lens layer.

In a possible implementation, a ratio of an area of a surface of each light-emitting portion facing the corresponding lens structure to an area of a surface of each lens structure facing the corresponding light-emitting portion is less than 35.2%.

In a possible implementation, in the lens structures from the first symmetry axis to two side edges along the first direction, the lens structures are sequentially staggered relative to the light-emitting portions.

In a possible implementation, in the lens structures from the first symmetry axis to one side edge along the first direction, the lens structures are sequentially staggered relative to the light-emitting portions.

An embodiment of the present disclosure further provides a near-eye display apparatus, including the display device provided according to the embodiments of the present disclosure.

DETAILED DESCRIPTION OF THE EMBODIMENTS

In order to make the objectives, technical solutions and advantages of embodiments of the present disclosure clearer, the technical solutions of the embodiments of the present disclosure will be clearly and completely described below with reference to the accompanying drawings of the embodiments of the present disclosure. Apparently, the described embodiments are only a part of the embodiments of the present disclosure, not all of the embodiments. Based on the described embodiments of the present disclosure, all other embodiments obtained by those of ordinary skill in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "first", "second" and the like used in the present disclosure do not indicate any order, quantity or importance, but are only used to distinguish different components. The words "comprise" or "include" and the like indicate that an element or item appearing before such word covers listed elements or items appearing after the word and equivalents thereof, and does not exclude other elements or items. The words "connect" or "couple" and the like are not limited to physical or mechanical connection, but may include electrical connection, whether direct or indirect. "Upper", "lower", "left", "right" and the like are only used to represent relative position relationships, and the relative position relationships may also change accordingly after an absolute position of a described object is changed.

In order to keep the following descriptions of the embodiments of the present disclosure clear and concise, detailed descriptions of known functions and known components are omitted in the present disclosure.

Figure 1:
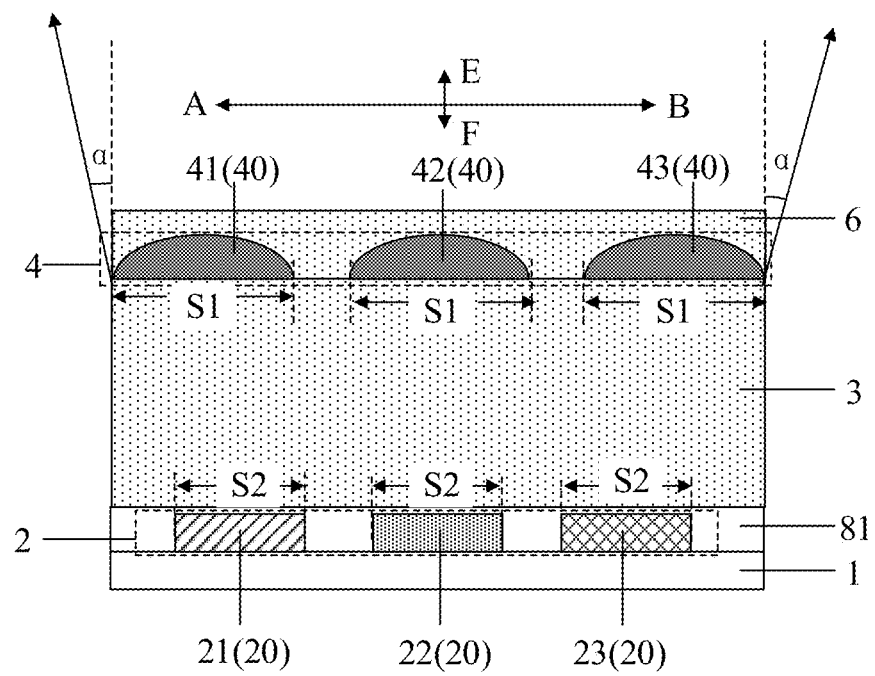
FIG. 1 is a schematic cross-sectional diagram of a display device according to an embodiment of the present disclosure.
Figure 2:
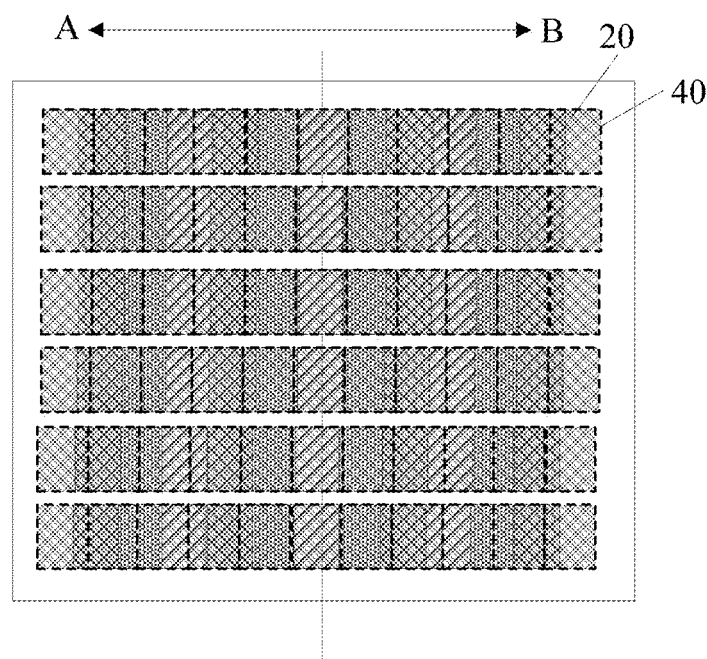
FIG. 2 is a schematic top-view diagram of a display device according to an embodiment of the present disclosure.
Figure 3:
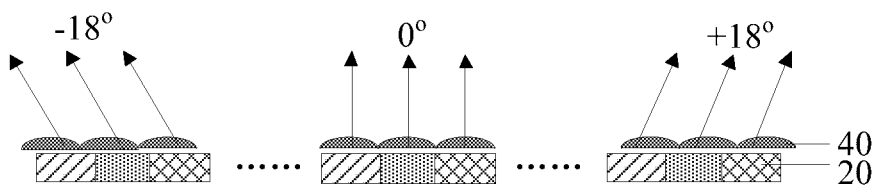
FIG. 3 is a schematic diagram of an arrangement relation of lens structures and light-emitting portions according to an embodiment of the present disclosure.

Referring to FIG. 1, FIG. 2 and FIG. 3, embodiments of the present disclosure provide a display device, including:
a base substrate 1;
a light-emitting layer 2 located on one side of the base substrate 1 and including a plurality of light-emitting portions 20; for example, the light-emitting layer 2 may include a red light-emitting portion 21 emitting red light, a green light-emitting portion 22 emitting green light, and a blue light-emitting portion 23 emitting blue light;
a package layer 3 located on a side, facing away from the base substrate 1, of the light-emitting layer 2; and
a lens layer 4 located on a side, facing away from the light-emitting layer 2, of the package layer 3; where the lens layer 4 includes a plurality of lens structures 40 which have one-to-one correspondence with the light-emitting portions 20 and protruding towards sides away from the light-emitting portions 20; on a cross section perpendicular to the base substrate 1, a center of an orthographic projection of at least one lens structure 40 on the base substrate 1 does not overlap a center of an orthographic projection of a corresponding light-emitting portion 20 on the base substrate 1.

In the embodiments of the present disclosure, the display device includes the lens layer located on the side, facing away from the light-emitting layer, of the package layer; the lens layer includes the plurality of lens structures which have one-to-one correspondence with the light-emitting portions; and since the lens structures have a light concentrating effect, the function of improving the light-emitting brightness of the display device is achieved. Meanwhile, the middle lens structure is aligned with the middle light-emitting portion, on the cross section perpendicular to the base substrate, the center of the orthographic projection of at least one lens structure 40 on the base substrate 1 does not overlap the center of the orthographic projection of the corresponding light-emitting portion 20 on the base substrate 1, and thus the lens structures may be staggered one by one relative to the light-emitting portions. The lens structure is greatly staggered relative to the light-emitting portion at the edge of the display device, further the maximum exit angle of light emitted from the light-emitting portions at the edge is a first angle, and the specific exit angle at the edge can be customized when the display device is applied to a near-eye display apparatus.

During specific implementation, as shown in FIG. 1, an area S1 of a surface of each lens structure 40 facing the corresponding light-emitting portion 20 is larger than an area S2 of a surface of each of the light-emitting portions 20 facing the lens structure 40; and in the lens structures 40 from a first symmetry axis EF to at least one side edge along a first direction AB, the lens structures 40 are sequentially staggered relative to the light-emitting portions 20, so that the maximum exit angle of light emitted from the light-emitting portions 20 at the edge is the first angle α, for example, the first angle α may be 18°. The first symmetry axis EF passes through a center of the display device and is perpendicular to the first direction AB.

The first angle α may be set according to the user's needs, and the first direction AB may also be specifically set according to the user's needs. For example, as shown in FIG. 2, the display device is a rectangular, and the first direction AB may be specifically a transverse direction of the display device. Specifically, the display device further includes a first insulating layer 81 between the package layer 3 and the light-emitting layer 2. A drive circuit (not shown in the figure) may also be located between the base substrate 1 and the light-emitting layer 2, and the drive circuit may be specifically the same as a conventional drive circuit which drives organic light-emitting devices to emit light.

Figure 4:
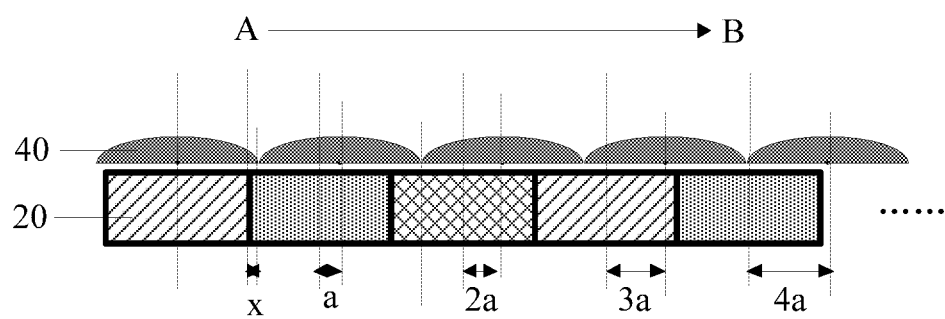
FIG. 4 is a schematic diagram of a staggering relation of lens structures and light-emitting portions according to an embodiment of the present disclosure.

During specific implementation, referring to FIG. 4, in the lens structures 40 from the middle lens structure 40 to at least one side edge along the first direction AB, staggered lengths of the lens structures 40 relative to the light-emitting portions 20 are sequentially increased. For example, as shown in FIG. 4, in the lens structures 40 from the middle lens structure 40 to at least one side edge along the first direction AB, a staggered length of the first lens structure 40 relative to the first light-emitting portion 20 is a, a staggered length of the second lens structure 40 relative to the second light-emitting portion 20 is $2a$, a staggered length of the third lens structure 40 relative to the third light-emitting portion 20 is $3a$, a staggered length of the fourth lens structure 40 relative to the fourth light-emitting portion 20 is $4a$, and so on.

During specific implementation, a length A of the surface of each lens structure 40 facing the corresponding light-emitting portion 20 in first direction AB, and a length B of the surface of each light-emitting portion 20 facing the corresponding lens structure 40 in the first direction AB, satisfy the following relationship:

A−B=L1/N, where L1 is a staggered length of the lens structure 40 at an edge relative to the light-emitting portion 20 at the edge in the first direction AB, and N is the number of the light-emitting portions 20 staggered from the middle light-emitting portion 20 to one side edge along the first direction AB. For example, as shown in FIG. 4, the staggered length of the center of the fourth lens structure 40 and the center of the fourth light-emitting portion 20 at the edge is $4a$, so A−B=$2x$=$4a/4$=a. In the embodiments of the present disclosure, when the length A of each lens structure 40 and the length B of each light-emitting portion 20 satisfy A−B=L1/N−1, it can realize that the staggered length of the lens structure 40 at the edge relative to the light-emitting portion 20 at the edge reaches a required staggered length, and the required staggered length can realize that the maximum exit angle of light emitted from the light-emitting portion 20 at the edge satisfies the first angle α.

Figure 5:
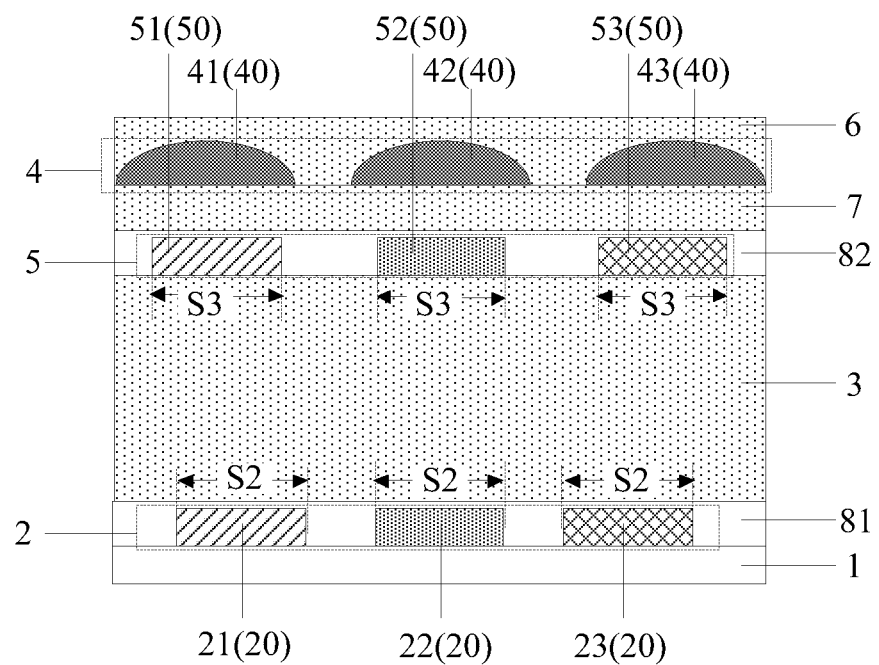
FIG. 5 is a schematic cross-sectional diagram of another display device according to an embodiment of the present disclosure.
Figure 6:
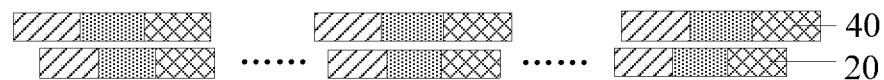
FIG. 6 is a schematic diagram of another arrangement relation of color resist portions and light-emitting portions according to an embodiment of the present disclosure.

During specific implementation, referring to FIG. 5 and FIG. 6, a color resist film layer 5 is further arranged between the package layer 3 and the lens layer 4 and includes a plurality of color resist portions 50; an area S3 of a surface of each color resist portion 50 facing the corresponding light-emitting portion 20 is greater than an area S2 of a surface of each light-emitting portion 20 facing the corresponding color resist portion 50; and in the color resist portions 50 from the first symmetry axis EF to at least one side edge along the first direction AB, the color resist portions 50 are sequentially staggered relative to the light-emitting portions 20. In the embodiments of the present disclosure, similar to that the lens structures 40 are staggered relative to the light-emitting portions 20, the area of the surface of each color resist portion 50 facing the corresponding light-emitting portion 20 is greater than the area of the surface of each light-emitting portion 20 facing the corresponding color resist portion 50, so that the color resist portions 50 can be sequentially staggered relative to the light-emitting portions 20 so as to accurately filter light during the propagation of the light in deflection at a specific angle, thereby improving the display picture quality of the display device.

Figure 7:
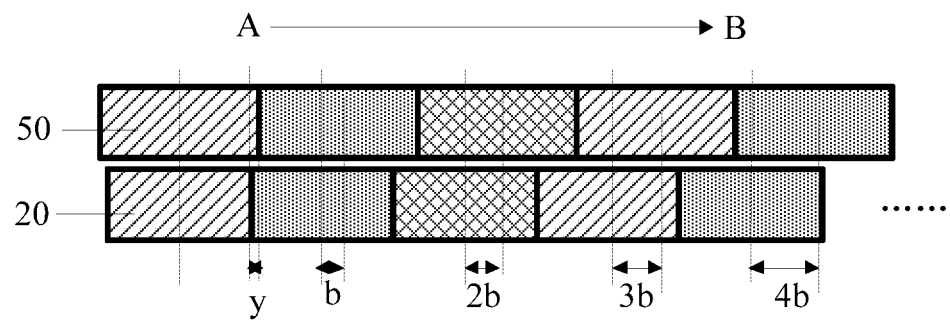
FIG. 7 is a schematic diagram of another staggering relation of color resist portions and light-emitting portions according to an embodiment of the present disclosure.

During specific implementation, referring to FIG. 7, in the color resist portions 50 from the first symmetry axis EF to at least one side edge along the first direction AB, staggered lengths of the color resist portions 50 relative to the light-emitting portions 20 are sequentially increased. For example, as shown in FIG. 7, in the color resist portions 50 from the middle color resist portion 50 to at least one side edge along the first direction AB, a staggered length of the first color resist portion 50 relative to the first light-emitting portion 20 is b, a staggered length of the second color resist portion 50 relative to the second light-emitting portion 20 is $2b$, a staggered length of the third color resist portion 50 relative to the third light-emitting portion 20 is $3b$, a staggered length of the fourth color resist portion 50 relative to the fourth light-emitting portion 20 is $4b$, and so on.

During specific implementation, a length C of a surface of each color resist portion 50 facing the corresponding lens structure 40 in first direction AB, and the length B of the surface of each light-emitting portion 20 facing the corresponding lens structure 40 in the first direction AB, satisfy the following relationship:

C−B=L2/N, where L2 is a staggered length of the color resist portion 50 at an edge relative to the light-emitting portion 20 at the edge in the first direction AB. For example, as shown in FIG. 7, the staggered length of the center of the fourth color resist portion 50 and the center of the fourth light-emitting portion 20 at the edge is $4b$, so C−B=$2y$=$4b/4$=b. In the embodiments of the present disclosure, when the length C of each color resist portion 50 and the length B of each light-emitting portion 20 satisfy C−B=L2/N−1, it can realize that the staggered length of the color resist portion 50 at the edge relative to the light-emitting portion 20 at the edge reaches a required staggered length, so as to accurately filter light.

During specific implementation, as shown in FIG. 5, the length C of the surface of each color resist portion 50 facing the corresponding lens structure 40 in the first direction AB is less than the length A of the surface of each lens structure 40 facing the corresponding light-emitting portion 20 in the first direction.

Figure 8:
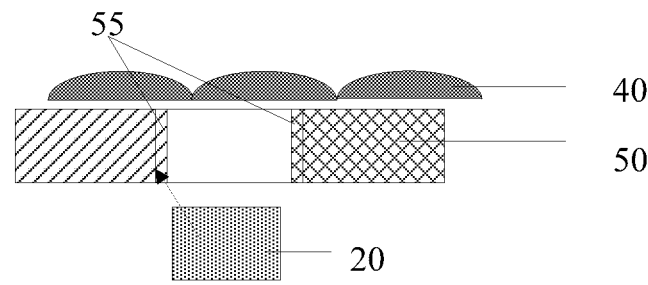
FIG. 8 is a schematic diagram of different color resist portions having an overlap according to an embodiment of the present disclosure.

During specific implementation, referring to FIG. 8, the adjacent color resist portions 50 have overlapping regions 55. In the embodiments of the present disclosure, the adjacent color resist portions 50 have the overlapping regions 55, and the color crosstalk among different colors can be improved by not emitting light in the overlapping regions 55.

Figure 9:
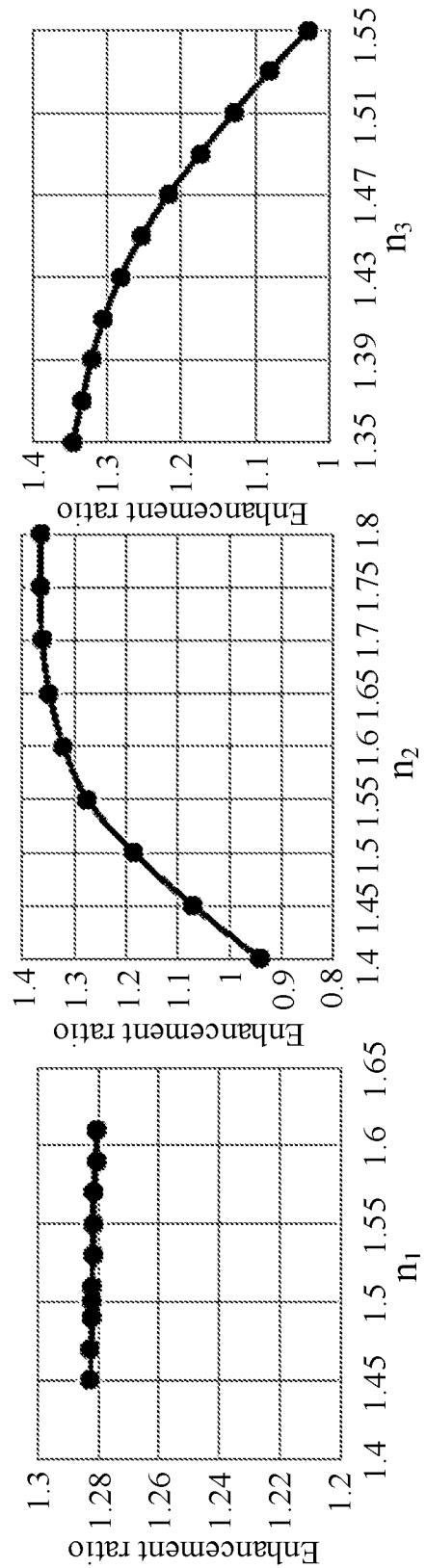
FIG. 9 is a schematic diagram of an enhancement ratio of light-emitting brightness of a display device by different film layers according to an embodiment of the present disclosure.

During specific implementation, as shown in FIG. 1 and FIG. 5, a protective layer 6 is further arranged on a side, facing away from the package layer 3, of the lens layer 4; a flat layer 7 is further arranged between the color resist film layer 5 and the lens layer 4; and a ratio of a refraction index of the protective layer 6 to a refraction index of the lens structures 40 is greater than 1.1. Specifically, a refraction index of the flat layer 7 is n1, the refraction index of the lens structures 40 is n2, and the refraction index of the protective layer 6 is n3. An enhancement ratio of the flat layer, the lens structures and the protective layer on the light-emitting brightness of the display device is shown in FIG. 9, the change of the refraction index n1 of the flat layer 7 has no effect on the brightness enhancement; the refraction index n2 of the lens structures 40 is greater than or equal to 1.55, and the enhancement effect is greater than 1.25 times; and the lower the refraction index n3 of the protective layer 6 is, the higher the enhancement. In order to enable the enhancement ratio to reach 1.25 times, n3 is required to be less than or equal to 1.45; the current display device is required to be 1.25 times or above, so the refraction ratio n2/n3 is required to be 1.1 times; and if the higher enhancement ratio is required, a higher refraction index ratio is needed.

During specific implementation, a ratio of the area of the surface of each light-emitting portion 20 facing the corresponding lens structure 40 to the area of the surface of each lens structure 40 facing the corresponding light-emitting portion 20 is less than 35.2%. In the embodiments of the present disclosure, the ratio of the area of the surface of each light-emitting portion 20 facing the corresponding lens structure 40 to the area of the surface of each lens structure 40 facing the corresponding light-emitting portion 20 is less than 35.2%, so that the edge angle may be customized to be greater than or equal to 10°.

During specific implementation, in the display device, it may be a specific angle customization achieved on both sides, i.e., in the lens structures from the first symmetry axis EF to two side edges along the first direction AB, the lens structures 40 are sequentially staggered relative to the light-emitting portions 20; or it may be an angle customization achieved on only one side, i.e., in the lens structures 40 from the first symmetry axis EF to one side edge along the first direction AB, the lens structures 40 are sequentially staggered relative to the light-emitting portions 20.

Figure 10:
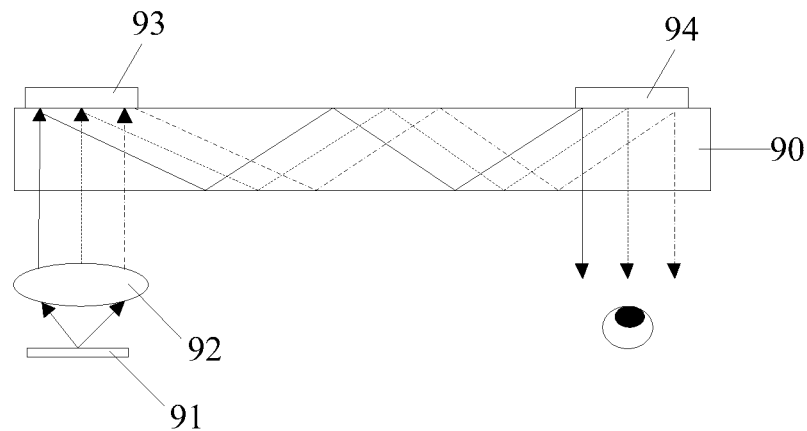
FIG. 10 is a schematic structural diagram of a near-eye display apparatus according to an embodiment of the present disclosure.

Based on the same inventive concept, referring to FIG. 10, embodiments of the present disclosure further provides a near-eye display apparatus, including a display (Microdisplay) provided according to the embodiments of the present disclosure. Specifically, as shown in FIG. 10, the near-eye display apparatus includes: an optical waveguide structure 90; a display device 91 arranged on a light-entry side of the optical waveguide structure 90; a collimator 92 arranged between the display device 91 and the optical waveguide structure 90; an in-coupling hologram 93 located at one end of a side, facing away from the display device 91, of the optical waveguide structure 90; and an out-coupling hologram 94 located at the other end of the side, facing away from the display device 91, of the optical waveguide structure 90, to couple the light in the optical waveguide structure 90 out to human eyes.

Figure 13:
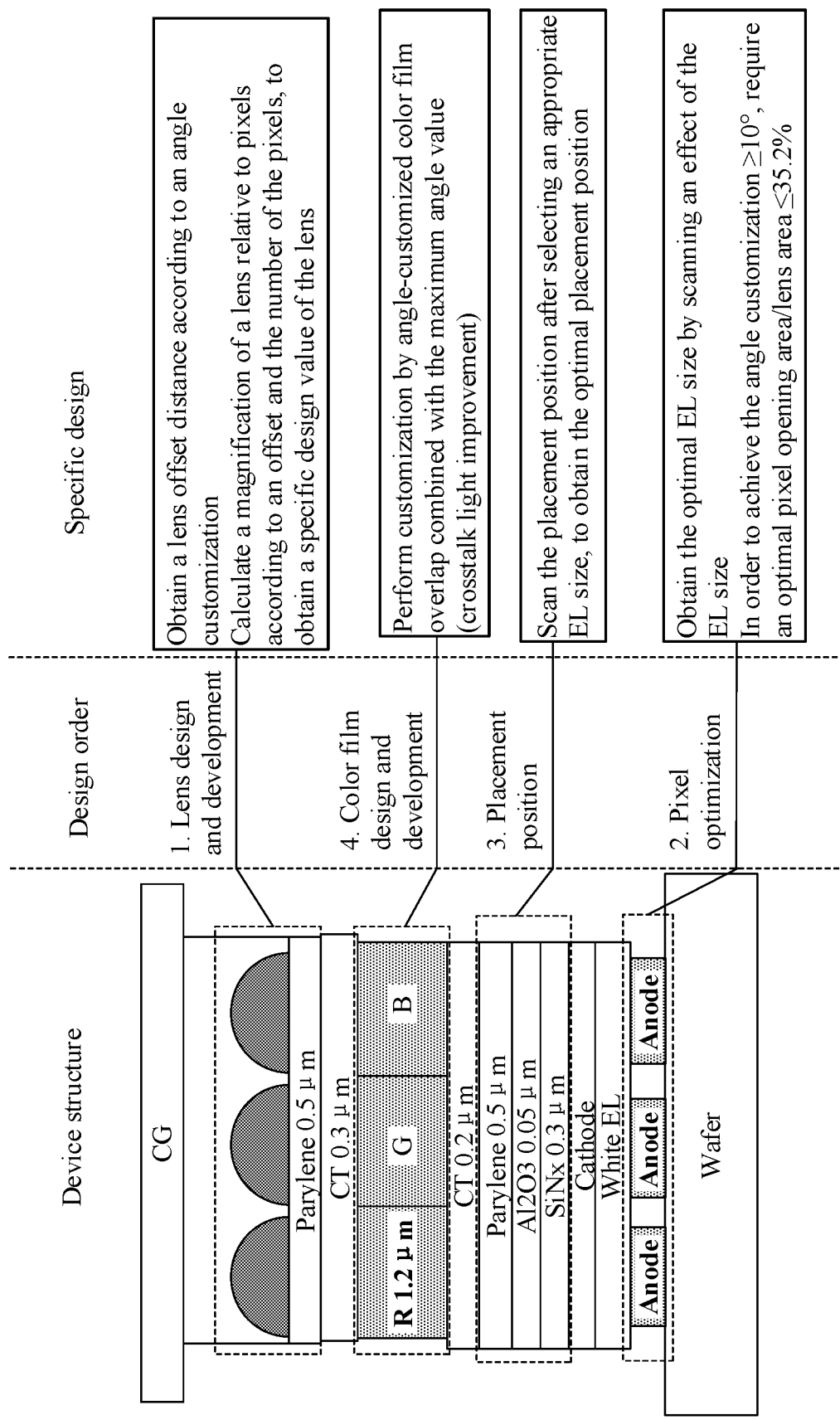
FIG. 13 is a schematic design flow diagram of a display device according to an embodiment of the present disclosure.

During specific implementation, as shown in FIG. 13, a design process of the display device in the embodiments of the present disclosure may be as follows.

Figure 11:
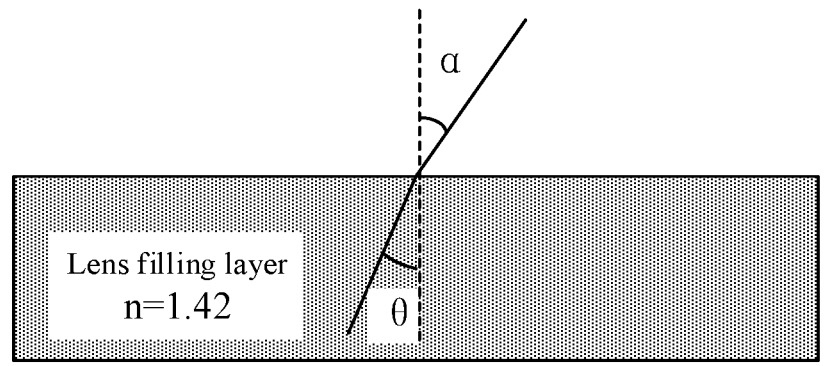
FIG. 11 is a schematic principle diagram of obtaining an exit angle according to an embodiment of the present disclosure.

1. According to the angle customization demand, a lens structure size (lens pitch) and a size of color resist portion (color film (CF) pitch) are designed; for example, the angle customization at the edge needs to meet the demand of 18°, design sizes and design positions of a lens and a color film may be obtained. 18° corresponds to the angle customization in air, and an exit angle in a medium (namely a protective layer 6) can be solved according to this angle, as shown in FIG. 11. According to the law of refraction, n1sinθ1=n2sinθ2, so θ2=arcsin(n1/n2)*sinθ1 may be derived, and the angle in the medium corresponding to 18° is θ=12.57°. Assuming that the lens is placed at 3 μm from a light-emitting pixel surface of a light-emitting layer, according to the deviation angle, a required misalignment value x may be calculated, x=h*tanθ2; according to 12.57°, the total misalignment of 0.66893 μm may be obtained; and according to the 0.39 full high definition (FHD) resolution of 1920*1080, it is known that the number of horizontal sub-pixels is 2880, and half that is 1440, so the single pixel misalignment=the total misalignment/the number of pixels, that is, 0.00046453 μm. The staggered gradient design (the sizes of the lenses are uniform, and the size of a single lens is 3.000465 μm) is adopted; and a method of the color film design is the same as the method of the lens design, which is not repeated, and the specific sizes may be shown in Table 1 and Table 2 below.

TABLE 1

| Angle in air | Exit angle | Curvature | Placement height | Total misalignment | Single pixel misalignment | Lens pitch |
| --- | --- | --- | --- | --- | --- | --- |
| 18 | 12.57 | 0.219388 | 3 | 0.66893 | 0.00046453 | 3.000465 |

TABLE 2

| Angle in air | Exit angle | Curvature | Placement height | Total misalignment | Single pixel misalignment | CF pitch |
| --- | --- | --- | --- | --- | --- | --- |
| 18 | 12.57 | 0.219388 | 0.9 | 0.200679 | 0.00013936 | 3.000139 |

(1) From the above Table 1 and Table 2, it can be seen that the lens pitch and CF pitch are designed, then the principle of lens design is to maximize a lens caliber, and according to the lens material characteristics combined with the device capacity, the lens caliber may be determined.

(2) The lens arch height design follows a hemispheric principle, and an arch height is designed as half the caliber.

Figure 12:
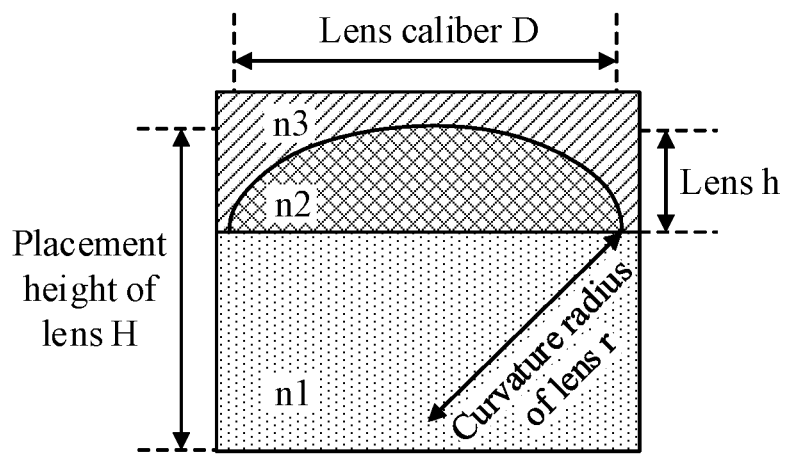
FIG. 12 is a schematic diagram of a size relation of adjacent film layers of lens structures according to an embodiment of the present disclosure.

(3) As shown in FIG. 12, a curvature radius r of the lens may be obtained according to the formula:

$$(r-h)^2 + \left(\frac{D}{2}\right)^2 = r^2.$$

(4) The relationship between upper film layer and lower film layer of the lens is determined, the lens layer adopts a high refraction material (n2≥1.55), the upper layer adopts a low refraction material (n3≤1.45) to ensure the refraction effect, and the lower layer adopts an organic material with good flatness and adhesion.

2. The design of the backplane of the display device: 1), the pixel region size is designed according to product specifications; 2), an aperture rate is designed according to the brightness demand; and 3), the pixel opening area is scanned by using optical simulation software to derive the optimal size setting of the light-emitting portion.

3. Package layer design (placement position selection): 1), a package thickness is generally less than a focal value of the lens, and the specific demand for the package thickness may be obtained by simulation to obtain the best brightness value; and 2), in terms of specific operations, the lens structure size and the light-emitting portion size in the above-mentioned step 1 and step 2 are selected, and then the placement height is scanned, to obtain the optimal placement position; and in the example, the placement height of 3 μm is selected.

4. Color film design: 1), the color film on the package layer is designed by using the design scheme in step 1, and the design of the CF pitch refers to the design method in step 1; and 2), color film overlay is adopted, that is, a red color resist portion and a green color resist portion overlap, the green color resist portion and a blue color resist portion overlap, the red color resist portion and the blue color resist portion overlay, and due to the existence of overlay, a laminated structure does not emit light, so that interference can be excluded.

After the specific design scheme is determined, the specific process can be made, and as shown in FIG. 13, the manufactured order from bottom to top is as follows:

1, the backplane of a light-emitting device is manufactured, following the electroluminescence (EL) opening design scheme;

2, the package layer is manufactured, and according to the specific thickness of the package layer, that is, the placement height of the lens, the specific package layer film layer and the thickness of the film layer are selected;

3, the color film is manufactured, and the color film pitch and color film overlay follow the design method of the color film;

4, the lens is manufactured by using photolithography melting or other embossing schemes, and the size meeting the design is adopted; and the refraction index and transmittance of the lens material meet the design requirements;

5, for selection of the upper layer material of the lens, the low refraction material is selected for matching and using of the lens, and the refraction index is less than or equal to 1.45; and 6, lamination of the cover plate CG is performed, to complete the entire manufactured process of the microdisplay.

The embodiments of the present disclosure has the following beneficial effects: in the embodiments of the present disclosure, the display device includes the lens layer located on the side, facing away from the light-emitting layer, of the package layer; the lens layer includes the plurality of lens structures which have one-to-one correspondence with the light-emitting portions; and since the lens structures have a light concentrating effect, the function of improving the light-emitting brightness of the display device is achieved. Meanwhile, the middle lens structure is aligned with the middle light-emitting portion, the center of the orthographic projection of at least one lens structure 40 on the base substrate 1 does not overlap the center of the orthographic projection of the corresponding light-emitting portion 20 on the base substrate 1, and thus the lens structures are staggered one by one relative to the light-emitting portions. The lens structure is greatly staggered relative to the light-emitting portion at the edge of the display device, thus the maximum exit angle of light emitted from the light-emitting portions at the edge is the first angle, and the specific exit angle at the edge can be customized when the display device is applied to the near-eye display apparatus.

Apparently, those skilled in the art can make various modifications and variations to the present disclosure without departing from the spirit and scope of the present disclosure. In this way, if these modifications and variations of the present disclosure fall within the scope of the claims of the present disclosure and equivalent technologies thereof, the present disclosure is also intended to include these modifications and variations.

What is claimed is:

1. A display device, comprising:
a base substrate;
a light-emitting layer arranged on one side of the base substrate and comprising a plurality of light-emitting portions;
a package layer arranged on a side, facing away from the base substrate, of the light-emitting layer; and
a lens layer arranged on a side, facing away from the light-emitting layer, of the package layer;
wherein the lens layer comprises a plurality of lens structures which have one-to-one correspondence with the light-emitting portions and protruding towards sides away from the light-emitting portions;
on a cross section perpendicular to the base substrate, a center of an orthographic projection of at least one of the plurality of lens structures on the base substrate does not overlap a center of an orthographic projection of a corresponding light-emitting portion on the base substrate; and
a ratio of an area of a surface of each of the light-emitting portions facing a corresponding lens structure to an area of a surface of each of the plurality of lens structures facing a corresponding light-emitting portion is less than 35.2%.

2. The display device according to claim 1, wherein
in the plurality of lens structures from a first symmetry axis to at least one side edge along a first direction, the plurality of lens structures are sequentially staggered relative to the light-emitting portions; and
the first symmetry axis passes through a center of the display device and is perpendicular to the first direction.

3. The display device according to claim 2, wherein in the plurality of lens structures from the first symmetry axis to the at least one side edge along the first direction, staggered lengths of the plurality of lens structures relative to the light-emitting portions are sequentially increased.

4. The display device according to claim 3, wherein a length A of the surface of each of the plurality of lens structures facing the corresponding light-emitting portion in the first direction, and a length B of the surface of each of the light-emitting portions facing the corresponding lens structure in the first direction, satisfy a following relationship:

A−B=L1/N, wherein L1 is a staggered length of the lens structure at an edge relative to the light-emitting portion at the edge in the first direction, and N is a quantity of the light-emitting portions staggered from a middle light-emitting portion to one side edge along the first direction.

5. The display device according to claim 4, wherein a color resist film layer is arranged between the package layer and the lens layer, and comprises a plurality of color resist portions;
an area of a surface of each of the plurality of color resist portions facing a corresponding light-emitting portion is greater than an area of a surface of each of the light-emitting portions facing a corresponding color resist portion; and
in the plurality of color resist portions from the first symmetry axis to at least one side edge along the first direction, the plurality of color resist portions are sequentially staggered relative to the light-emitting portions.

6. The display device according to claim 5, wherein in the plurality of color resist portions from the first symmetry axis to the at least one side edge along the first direction, staggered lengths of the plurality of color resist portions relative to the light-emitting portions are sequentially increased.

7. The display device according to claim 6, wherein a length C of a surface of each of the plurality of color resist portions facing the corresponding lens structure in the first direction, and the length B of the surface of each of the light-emitting portions facing the corresponding lens structure in the first direction, satisfy a following relationship:

C−B=L2/N, wherein L2 is a staggered length of the color resist portion at an edge relative to the light-emitting portion at the edge in the first direction.

8. The display device according to claim 7, wherein the length of the surface of each of the plurality of color resist portions facing the corresponding lens structure in the first direction is less than the length of the surface of each of the plurality of lens structures facing the corresponding light-emitting portion in the first direction.

9. The display device according to claim 5, wherein adjacent color resist portions have an overlapping region.

10. The display device according to claim 5, wherein a protective layer is arranged on a side, facing away from the package layer, of the lens layer; and
a ratio of a refraction index of the protective layer to a refraction index of the plurality of lens structures is greater than 1.1.

11. The display device according to claim 10, wherein a flat layer is arranged between the color resist film layer and the lens layer.

12. The display device according to claim 1, wherein in the plurality of lens structures from a first symmetry axis to two side edges along a first direction, the plurality of lens structures are sequentially staggered relative to the light-emitting portions.

13. The display device according to claim 1, wherein in the plurality of lens structures from a first symmetry axis to one side edge along a first direction, the plurality of lens structures are sequentially staggered relative to the light-emitting portions.

14. A near-eye display apparatus, comprising the display device according to claim 1.

* * * * *